United States Patent
Sakaguchi

(10) Patent No.: US 6,951,796 B2
(45) Date of Patent: Oct. 4, 2005

(54) SUBSTRATE AND MANUFACTURING METHOD THEREFOR

(75) Inventor: Kiyofumi Sakaguchi, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 85 days.

(21) Appl. No.: 10/653,950

(22) Filed: Sep. 4, 2003

(65) Prior Publication Data

US 2004/0058511 A1 Mar. 25, 2004

(30) Foreign Application Priority Data

Sep. 4, 2002 (JP) ........................................ 2002-258972
Sep. 4, 2002 (JP) ........................................ 2002-258973

(51) Int. Cl.[7] ........................... H01L 21/76; H01L 21/20
(52) U.S. Cl. ........................ 438/413; 48/458; 48/479
(58) Field of Search ............................... 438/413, 458, 438/479, 969; 257/347

(56) References Cited

U.S. PATENT DOCUMENTS

| | | | | |
|---|---|---|---|---|
| 3,372,063 A | * | 3/1968 | Suzuki et al. | 438/413 |
| 4,498,951 A | * | 2/1985 | Tamura et al. | 117/43 |
| 4,549,926 A | * | 10/1985 | Corboy et al. | 438/412 |
| 4,585,493 A | * | 4/1986 | Anthony | 117/42 |
| 4,725,561 A | * | 2/1988 | Haond et al. | 438/404 |
| 4,851,078 A | | 7/1989 | Short et al. | 438/406 |
| 4,874,718 A | * | 10/1989 | Inoue | 438/481 |
| 4,952,526 A | * | 8/1990 | Pribat et al. | 438/412 |

(Continued)

FOREIGN PATENT DOCUMENTS

| | | | | |
|---|---|---|---|---|
| EP | 1100124 A1 | * | 5/2001 | .......... H01L/21/76 |
| FR | 2774511 | | 8/1999 | |
| JP | 1-144665 | | 6/1989 | |
| JP | 11-17001 | | 1/1999 | |
| JP | 2001-320033 | | 11/2001 | |
| TW | 437078 | | 5/2001 | |

*Primary Examiner*—Matthew Smith
*Assistant Examiner*—Lex H. Malsawma
(74) *Attorney, Agent, or Firm*—Fitzpatrick, Cella, Harper & Scinto

(57) ABSTRACT

There is provided a method of manufacturing a substrate having a partial insulating layer under a semiconductor layer. A partial SOI substrate (40) is obtained by performing steps of forming the first substrate which has a separation layer, the first semiconductor layer (13) on the separation layer, a partial insulating layer (14a) on the first semiconductor layer (13), and second semiconductor layers (15b, 16b) on the first semiconductor layer (13) exposed in the partial insulating layer (14a) and partial insulating layer (14a), bonding the second substrate (20) to the second semiconductor layers (15b, 16b) on the first substrate to form a bonded substrate stack, and splitting the bonded substrate stack at the separation layer.

12 Claims, 10 Drawing Sheets

U.S. PATENT DOCUMENTS

| | | | |
|---|---|---|---|
| 4,963,505 A | 10/1990 | Fujii et al. | 438/405 |
| 5,084,419 A * | 1/1992 | Sakao | 438/400 |
| 5,086,011 A * | 2/1992 | Shiota | 438/406 |
| 5,138,422 A | 8/1992 | Fujii et al. | 257/401 |
| 5,298,449 A | 3/1994 | Kikuchi | 437/63 |
| 5,371,037 A | 12/1994 | Yonehara | 438/459 |
| 5,374,564 A | 12/1994 | Bruel | 438/455 |
| 5,397,735 A * | 3/1995 | Mercandalli et al. | 438/459 |
| 5,402,989 A | 4/1995 | Takasu | 257/506 |
| 5,403,771 A | 4/1995 | Nishida et al. | 438/97 |
| 5,854,123 A | 12/1998 | Sato et al. | 438/507 |
| 5,856,229 A | 1/1999 | Sakaguchi et al. | 438/406 |
| 5,894,152 A | 4/1999 | Jaso et al. | 257/347 |
| 5,945,703 A * | 8/1999 | Furukawa et al. | 257/301 |
| 5,966,620 A | 10/1999 | Sakaguchi et al. | 438/455 |
| 5,994,207 A | 11/1999 | Henley et al. | 438/515 |
| 6,054,363 A | 4/2000 | Sakaguchi et al. | 438/406 |
| 6,100,165 A | 8/2000 | Sakaguchi et al. | 438/455 |
| 6,100,166 A | 8/2000 | Sakaguchi et al. | 438/455 |
| 6,103,598 A | 8/2000 | Yamagata et al. | 438/459 |
| 6,121,112 A | 9/2000 | Sakaguchi et al. | 438/406 |
| 6,136,684 A | 10/2000 | Sato et al. | 438/624 |
| 6,191,007 B1 | 2/2001 | Matsui et al. | 438/459 |
| 6,246,068 B1 | 6/2001 | Sato et al. | 257/3 |
| 6,294,478 B1 | 9/2001 | Sakaguchi et al. | 438/753 |
| 6,323,108 B1 | 11/2001 | Kub et al. | 438/458 |
| 6,342,433 B1 | 1/2002 | Ohmi et al. | 438/455 |
| 6,350,702 B2 | 2/2002 | Sakaguchi et al. | 438/753 |
| 6,382,292 B1 | 5/2002 | Ohmi et al. | 156/584 |
| 6,562,692 B1 * | 5/2003 | Oi | 438/406 |
| 6,602,767 B2 | 8/2003 | Nishida et al. | 438/507 |
| 6,605,518 B1 | 8/2003 | Ohmi et al. | 438/458 |
| 6,617,668 B1 | 9/2003 | Koide et al. | 257/615 |
| 2001/0025991 A1 | 10/2001 | Kim | 257/347 |
| 2004/0033674 A1 * | 2/2004 | Todd | 438/478 |
| 2004/0048454 A1 | 3/2004 | Sakaguchi | 438/486 |

* cited by examiner

SUBSTRATE AND MANUFACTURING METHOD THEREFOR

FIELD OF THE INVENTION

The present invention relates to a substrate and manufacturing method therefor and, more particularly, to a substrate having a partial insulating layer inside and a manufacturing method therefor.

BACKGROUND OF THE INVENTION

In recent years, a substrate which has a semiconductor layer on an insulating layer has received attention. This substrate is referred to as a Semiconductor-On-Insulator substrate or Silicon-On-Insulator substrate. The latter substrate is one of Semiconductor-On-Insulator substrates and has a semiconductor layer made of silicon. Both Semiconductor-On-Insulator substrates and Silicon-On-Insulator substrates are called SOI substrates.

As an SOI substrate, a substrate which has an insulating layer not in the entire region but in a partial region under a semiconductor layer or an Si layer has been proposed. A related art is disclosed in Japanese Patent No. 2794702 (semiconductor device manufacturing method). A manufacturing method disclosed in Japanese Patent No. 2794702 forms an $n^+$-layer on an $n^-$-silicon substrate serving as the first substrate, forms a thermal oxide film ($SiO_2$) on the $n^+$-layer, and then removes an unnecessary portion of the thermal oxide film. With this operation, the thermal oxide film is partially left on the $n^+$-layer. After that, an epitaxial layer is grown on an exposed portion of the $n^+$-layer. At this time, a polysilicon layer is formed on the partial thermal oxide film. The main surface of the first substrate is polished such that the epitaxial and polysilicon layers have the same height. Then, the main surface side of the first substrate is bonded to the second substrate, thereby obtaining a final substrate. This final substrate has a partial buried insulating layer (thermal oxide film) under a portion constituted by the first substrate. A semiconductor device is formed on the portion constituted by the first substrate.

In the manufacturing method disclosed in Japanese Patent No. 2794702, a portion on which a device is to be formed is the first substrate itself in a final substrate to be manufactured, and the thickness is very large. For this reason, it is difficult for the final substrate to enjoy the advantages of a general SOI substrate. More specifically, a substrate obtained by the manufacturing method disclosed in Japanese Patent No. 2794702 cannot sufficiently exhibit the advantages of an SOI substrate, such as low power consumption, high-speed operation, and the like.

Also, assume that in a substrate manufactured by the manufacturing method disclosed in Japanese Patent No. 2794702, a device structure (i.e., a device structure having a larger size in the direction of depth than a device structure to be formed in a region with a buried insulating layer) having a depth larger than the thickness of the first substrate is formed in a region without a buried insulating layer. In this case, the device structure is so formed as to extend through the first substrate, epitaxial layer, and second substrate. A device structure formed to extend through bulk silicon (the first and second substrates) and an epitaxial layer cannot easily obtain high quality. To solve this problem, an existing device structure, an existing device manufacturing process, existing process parameters, and the like may inevitably be changed.

From another point of view, the manufacturing method disclosed in Japanese Patent No. 2794702 polishes the first substrate, in which the epitaxial layer and polysilicon layer are combined on the surface, before bonding the first and second substrates. However, there is a limit to planarization of the surface of the first substrate by the polishing step. More specifically, if the polishing conditions are set for the epitaxial layer, the planarity of the polysilicon layer becomes poor. On the other hand, if the polishing conditions are set for the polysilicon layer, the planarity of the epitaxial layer becomes poor. Additionally, a level difference may occur between the epitaxial layer and the polysilicon layer.

If the first substrate in which the epitaxial layer and polysilicon layer are combined on the surface has poor surface planarity, poor bonding is likely to occur in bonding the first substrate to the second substrate. This poor bonding interferes with the formation of a high-quality device.

SUMMARY OF THE INVENTION

The present invention has been made on the basis of the above consideration.

The first to third aspects of the present invention have as their object to, e.g., ensure the advantages of an SOI substrate for a substrate having a partial insulating layer under a semiconductor layer.

According to the first aspect of the present invention, there is provided a substrate manufacturing method comprising a step of forming a first substrate which has a separation layer, a first semiconductor layer on the separation layer, a partial insulating layer on the first semiconductor layer, and a second semiconductor layer on the first semiconductor layer exposed in the partial insulating layer and the partial insulating layer, a step of bonding a second substrate to the second semiconductor layer on the first substrate to form a bonded substrate stack, and a step of splitting the bonded substrate stack at the separation layer.

According to a preferred embodiment of the present invention, the method preferably further comprises a step of planarizing the second semiconductor layer of the first substrate before bonding the second substrate to the second semiconductor layer on the first substrate.

According to a preferred embodiment of the present invention, in growing the second semiconductor layer, a single-crystal semiconductor layer made of the same material as a material of the first semiconductor layer is preferably grown as a part of the second semiconductor layer on the first semiconductor layer exposed in the insulating layer.

According to a preferred embodiment of the present invention, preferably, in growing the second semiconductor layer, a single-crystal semiconductor layer made of the same material as a material of the first semiconductor layer is grown as a part of the second semiconductor layer on the first semiconductor layer exposed in the insulating layer, and a polycrystalline semiconductor layer made of the same material as a material of the first semiconductor layer is grown as another part of the second semiconductor layer on the partial insulating layer.

According to a preferred embodiment of the present invention, the step of forming the first substrate preferably includes a step of forming a porous layer serving as the separation layer on a semiconductor substrate by anodization and sequentially forming the first semiconductor layer and partial insulating layer on the porous layer.

Alternatively, the step of forming the first substrate preferably includes a step of forming the separation layer by implanting ions into a semiconductor substrate.

According to a preferred embodiment of the present invention, at least a surface, to be bonded to the first substrate, of the second substrate preferably comprises an insulator.

According to the second aspect of the present invention, there is provided a substrate manufacturing method comprising a step of forming a first substrate which has a first semiconductor layer, a partial insulating layer on the first semiconductor layer, and a second semiconductor layer on the first semiconductor layer exposed in the partial insulating layer and the partial insulating layer, a step of bonding a second substrate to the second semiconductor layer on the first substrate to form a bonded substrate stack, and a step of grinding the first substrate constituting a part of the bonded substrate stack from a back surface of the first substrate to thin the bonded substrate stack.

According to the third aspect of the present invention, there is provided a substrate comprising a first insulating layer arranged over a whole region inside the substrate, a second partial insulating layer arranged adjacent to or spaced apart from the first insulating layer, on the first insulating layer, and a semiconductor layer arranged on a surface of the substrate.

The fourth and fifth aspects of the present invention have as their object to improve the quality of a substrate manufactured through, e.g., a step of bonding two substrates.

According to the fourth aspect of the present invention, there is provided a substrate manufacturing method comprising a step of forming a first substrate which has a first semiconductor layer, a partial insulating layer on the first semiconductor layer, and a second semiconductor layer on the first semiconductor layer exposed in the partial insulating layer and the partial insulating layer, a step of forming a third layer on an entire surface of the second semiconductor layer of the first substrate, and a step of bonding a second substrate to the third layer of the first substrate to form a bonded substrate stack.

According to a preferred embodiment of the present invention, the method preferably further comprises a step of removing a part of the first substrate from the bonded substrate stack such that the first semiconductor layer is exposed.

According to a preferred embodiment of the present invention, preferably, the step of forming the first substrate includes a step of forming a separation layer under the first semiconductor layer, and the method further comprises a step of splitting the bonded substrate stack at the separation layer.

According to a preferred embodiment of the present invention, the method preferably further comprises a step of planarizing a surface of the third layer after the step of forming the third layer and before the step of forming the bonded substrate stack.

According to a preferred embodiment of the present invention, the method preferably further comprises a step of planarizing a surface of the second semiconductor layer after the step of forming the first substrate and before the step of forming the third layer.

According to a preferred embodiment of the present invention, in the step of forming the third layer, a layer having a structure substantially uniform across a surface of the layer is preferably formed as the third layer.

According to a preferred embodiment of the present invention, in the step of forming the third layer, a polycrystalline semiconductor layer, an amorphous semiconductor layer, or an insulating layer is preferably formed as the third layer. If the insulating layer is formed as the third layer, it preferably comprises an oxide film and the oxide film is preferably formed by CVD.

According to a preferred embodiment of the present invention, in growing the second semiconductor layer, a single-crystal semiconductor layer made of the same material as a material of the first semiconductor layer is preferably grown as a part of the second semiconductor layer on the first semiconductor layer exposed in the insulating layer.

According to a preferred embodiment of the present invention, in growing the second semiconductor layer, a single-crystal semiconductor layer made of the same material as a material of the first semiconductor layer is preferably grown as a part of the second semiconductor layer on the first semiconductor layer exposed in the insulating layer, and a polycrystalline semiconductor layer made of the same material as the first semiconductor layer is grown as another part of the second semiconductor layer on the partial insulating layer.

According to a preferred embodiment of the present invention, the step of forming the first substrate preferably includes a step of forming a porous layer serving as the separation layer on a semiconductor substrate by anodization and sequentially forming the first semiconductor layer and partial insulating layer on the porous layer.

According to the fifth aspect of the present invention, there is provided a substrate comprising a first semiconductor layer arranged on a surface of the substrate, a first partial insulating layer arranged under the first semiconductor layer, a second semiconductor layer arranged adjacent to and under the first semiconductor layer in the first partial insulating layer and the first partial insulating layer, and a third layer arranged adjacent to and under the second semiconductor layer.

According to a preferred embodiment of the present invention, the third layer preferably has a lower planarized surface. The substrate preferably further comprises a handle substrate arranged adjacent to or under the third layer through a fourth layer.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

[First Embodiment]

A preferred embodiment of the present invention will be described with reference to the accompanying drawings.

FIGS. 1A to 1K are views for explaining a substrate manufacturing method according to the preferred embodiment of the present invention. In the step shown in FIG. 1A, a single-crystal Si substrate (seed substrate) 11 is prepared, and in the step shown in FIG. 1B, a separation layer 12 is formed on the surface of the single-crystal Si substrate 11. As the separation layer 12, e.g., a porous layer which can be formed by anodizing the surface of the single-crystal Si substrate 11 is preferably employed. This anodization can be performed by, e.g., placing an anode and cathode in an electrolyte solution containing hydrofluoric acid, placing the single-crystal Si substrate 11 between the electrodes, and supplying a current between them. The porous layer may comprise two or more layers with different porosities.

Figure 1A:
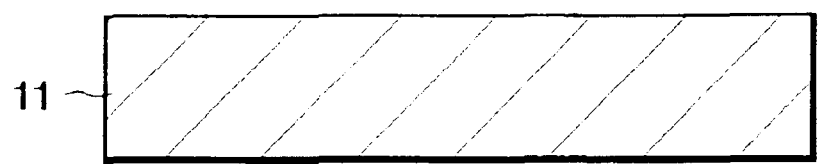
FIGS. 1A to 1J are views for explaining a substrate manufacturing method according to a preferred embodiment of the present invention.
Figure 1B:
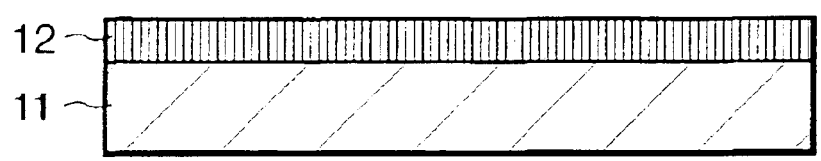
Figure 1C:
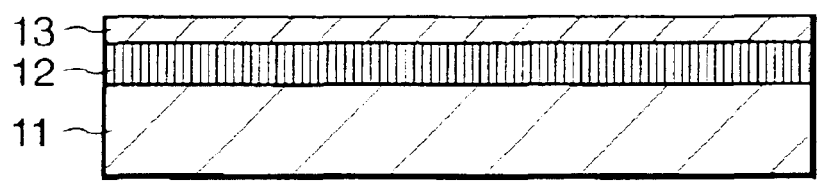

In the step shown in FIG. 1C, a single-crystal Si layer (first semiconductor layer) 13 is formed on the separation layer 12 by epitaxial growth. Epitaxial growth can form the single-crystal Si layer 13 of good quality.

Instead of the method shown in FIGS. 1B and 1C, e.g., a method of implanting ions such as hydrogen ions or the like at a predetermined depth from the surface of the single-crystal Si substrate 11 to form an ion implantation layer serving as the separation layer 12 may be adopted. In this case, a portion on the surface side from the viewpoint of the separation layer 12 functions as the single-crystal Si layer 13.

Although an example in which a single-crystal Si layer is formed on the separation layer 12 will mainly be explained here, a semiconductor layer made of another material may be formed on the separation layer 12.

Figure 1D:
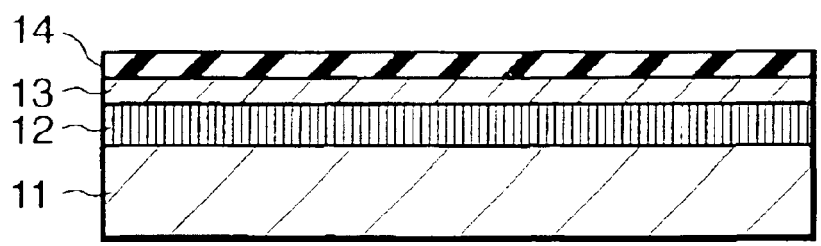

In the step shown in FIG. 1D, an $SiO_2$ layer 14 serving as an insulating layer is formed on the single-crystal Si layer 13. The $SiO_2$ layer 14 can be formed by, e.g., thermal oxidation. Thermal oxidation can form an $SiO_2$ layer of good quality.

Figure 1E:
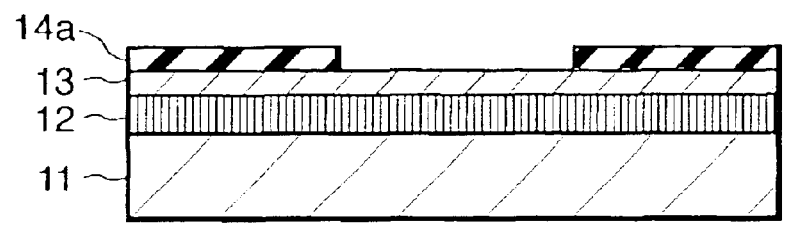

In the step shown in FIG. 1E, the $SiO_2$ layer 14 is patterned to form a partial $SiO_2$ layer 14a. A partial $SiO_2$ layer is defined as an $SiO_2$ layer which is formed such that the single-crystal Si layer (semiconductor layer) 13 is at least partially exposed. The $SiO_2$ layer 14 can be patterned by, e.g., the following operation. After a mask material is formed on the $SiO_2$ layer 14, the mask material is patterned by lithography (resist coating, exposure, development, and etching) to form an opening. The $SiO_2$ layer 14 exposed at the bottom of the opening is then etched by, e.g., reactive ion etching (RIE).

Instead of the steps shown in FIGS. 1D and 1E, e.g., a step of covering the surface except a region in which the partial $SiO_2$ layer 14a is to be formed with a mask pattern and forming the partial $SiO_2$ layer 14a only in an exposed portion may be adopted.

Figure 1F:
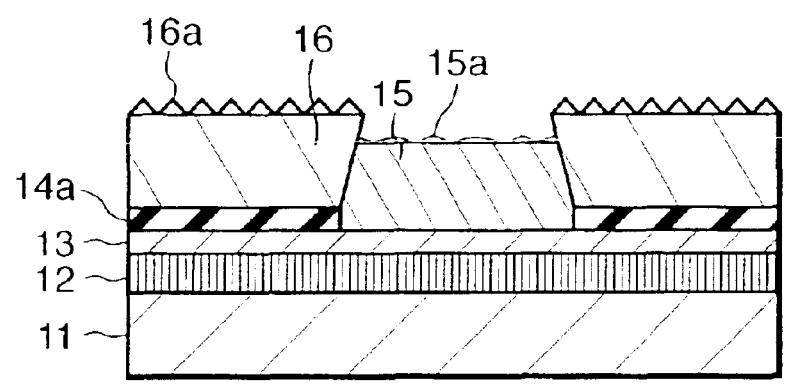

In the step shown in FIG. 1F, a single-crystal Si layer (second semiconductor layer) 15 is grown by epitaxial growth on an exposed portion of the single-crystal Si layer 13 in the partial $SiO_2$ layer 14a. At this time, a polysilicon layer 16 may be formed on the partial insulating layer 14a. The single-crystal Si layer 15 may be grown on the single-crystal Si layer 13 on the condition that the polysilicon layer 16 be not formed on the partial insulating layer 14a.

Typically, the single-crystal Si layer 15 and polysilicon layer 16 are different in growth rate, and a level difference may occur between the single-crystal Si layer 15 and the polysilicon layer 16, as exaggeratedly shown in FIG. 1F. Three-dimensional patterns 15a and 16a can be formed on the surfaces of the single-crystal Si layer 15 and polysilicon layer 16, respectively.

Assume that in the step shown in FIG. 1C, a semiconductor layer made of another material is to be formed instead of the single-crystal Si layer 13. In this case, a semiconductor layer made of the same material as that of the formed semiconductor layer is preferably formed on the semiconductor layer in the step shown in FIG. 1F.

Figure 1G:
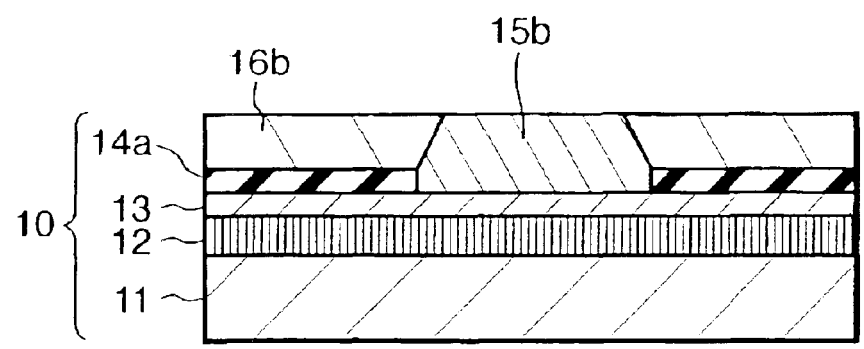

In the step shown in FIG. 1G, the surface of the substrate shown in FIG. 1F is planarized by polishing, grinding, or the like. In this manner, a first substrate 10 is so formed as to have the single-crystal Si layer (first semiconductor layer) 13 on the porous layer or ion implantation layer as the separation layer 12, the partial $SiO_2$ layer (insulating layer) 14a on the single-crystal Si layer 13, and a single-crystal Si layer (second semiconductor layer) 15b on the single-crystal Si layer 13 and a polysilicon layer (second semiconductor layer) 16b on the insulating layer 14a. Although a substrate having a structure shown in FIG. 1G is referred to as the first substrate for the sake of convenience, a substrate having a structure shown in any one of FIGS. 1A to 1F may also be referred to as the first substrate.

Figure 1H:
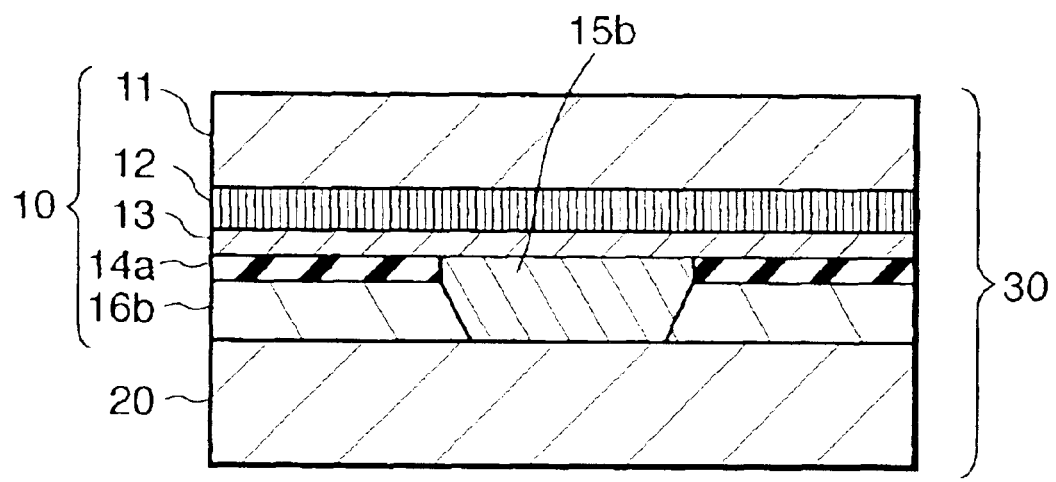

In the step shown in FIG. 1H, a second substrate (handle substrate) 20 is bonded to the surface (a surface in which the single-crystal Si layer 15b and polysilicon layer 16b are exposed) of the first substrate 10 shown in FIG. 1G to form a bonded substrate stack 30. An $SiO_2$ layer (insulating layer) may be formed on the surface of the first substrate 10 by, e.g., thermal oxidation, prior to the bonding. As the second substrate 20, a single-crystal Si substrate or a substrate obtained by forming an insulating layer such as an $SiO_2$ layer on the surface can typically be used. However, any other substrate such as an insulating substrate (e.g., a glass substrate) may be adopted as the second substrate 20.

Figure 1I:
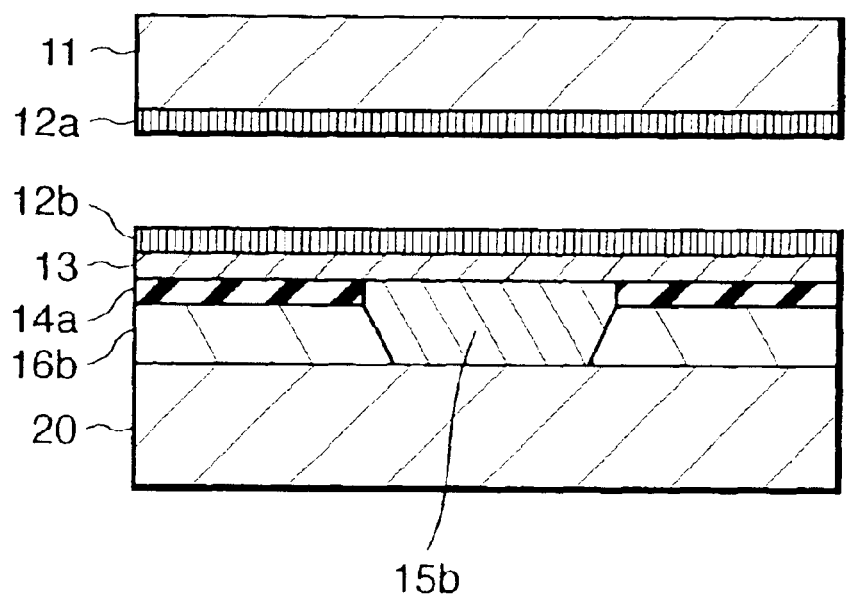

In the step shown in FIG. 1I, the bonded substrate stack 30 is split into two substrates by splitting the bonded substrate stack 30 at the separation layer 12. This splitting can be performed by, e.g., using a fluid. As a method of using a fluid, a method of forming a jet of a fluid (liquid or gas) and injecting it to the separation layer 12, a method of utilizing the static pressure of a fluid, or the like is preferably used. Among these methods, a method of utilizing water as a fluid is referred to as a water jet method. The above-mentioned splitting can also be performed by, e.g., annealing the bonded substrate stack 30. Such splitting by annealing is particularly effective in forming an ion implantation layer as the separation layer 12. Additionally, the splitting can be performed by, e.g., inserting a member such as a solid wedge into the separation layer 12.

In addition to the above-mentioned splitting methods, a grinding and polishing method in which the back surface (exposed surface) of the bonded substrate stack 30 is ground and polished to leave a single-crystal Si layer with a predetermined thickness on the insulating layer 14a may be adopted. In this case, the separation layer 12 need not be formed in advance.

Figure 1J:
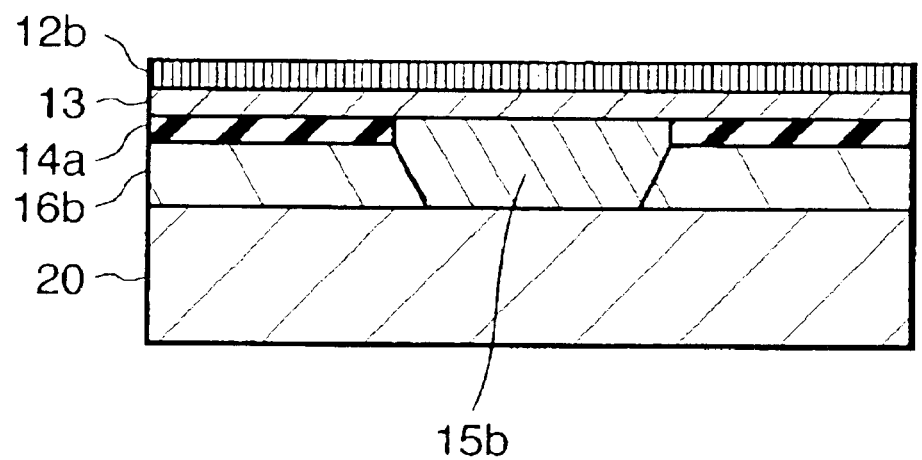

In the step shown in FIG. 1J, a separation layer 12b left on the single-crystal Si layer 13 of the second substrate 20 is removed using an etchant or the like. At this time, the single-crystal Si layer 13 can be used as an etching stopper layer. Then, the surface of the substrate may be planarized by performing a planarizing step such as a hydrogen annealing step, polishing step, or the like, as needed.

Figure 1K:
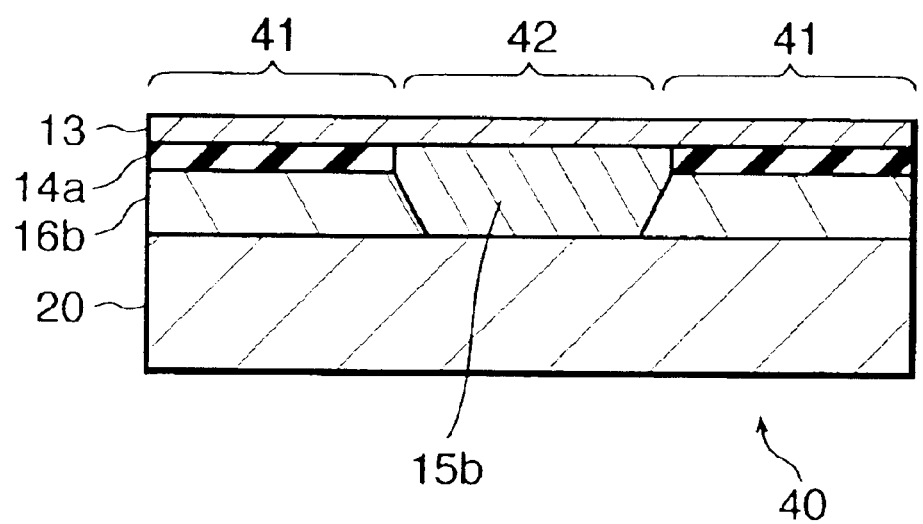
FIG. 1K is a view showing the structure of a substrate according to the preferred embodiment of the present invention.

With the above-mentioned method, a semiconductor substrate (partial SOI substrate) 40 as shown in FIG. 1K is obtained. The semiconductor substrate 40 shown in FIG. 1K has the thin single-crystal Si layer (first semiconductor layer) 13 on its surface and the partial SiO$_2$ layer (insulating layer) 14a and single-crystal Si layer 15b under the single-crystal Si layer 13. A thin single-crystal Si layer means a layer thinner than a general semiconductor substrate. To exhibit the advantages of an SOI substrate, the thickness of the single-crystal Si layer (first semiconductor layer) 13 is preferably, e.g., 10 μm or less, and more preferably, 5 nm to 2 μm.

A region (SOI region) 41 with the partial SiO$_2$ layer (insulating layer) 14a as a buried insulating layer out of the semiconductor substrate 40 has the same properties as those of an SOI substrate which has a buried insulating film over the whole region. A region (non-SOI region) 42 without the partial insulating layer 14a out of the semiconductor substrate 40, i.e., a region which has the single-crystal Si layer 15b under the single-crystal Si layer 13 has substantially the same properties as those of an Si substrate which has an epitaxial Si layer on its surface. The single-crystal Si layer 15b is a layer which is formed by epitaxial growth using as the underlying layer the single-crystal Si layer 13 formed by epitaxial growth. For this reason, a defect hardly occurs in the interface between the single-crystal Si layer 13 and the single-crystal Si layer 15b. Accordingly, if the semiconductor substrate 40 is used, a high-quality device can be formed even when a device (e.g., a trench capacitor) having a structure deeper than that of a device to be formed in the SOI region is formed in the non-SOI region.

The semiconductor substrate 40 which can be manufactured by this embodiment is useful in forming a logic circuit in the SOI region 41 and forming a DRAM which has a trench-type capacitor in the non-SOI region 42. Alternatively, the semiconductor substrate 40 is useful in forming a memory cell transistor of a DRAM and a logic circuit on the SOI region 41 and forming a memory cell capacitor of the DRAM in the non-SOI region 42. Examples of the thicknesses of the single-crystal Si layer in the SOI and non-SOI regions in the semiconductor substrate 40 used to form a DRAM will be given. The single-crystal Si layer has a thickness of about 100 nm in the SOI region while it has a thickness of about several μm to 10 μm in the non-SOI region.

Figure 2:
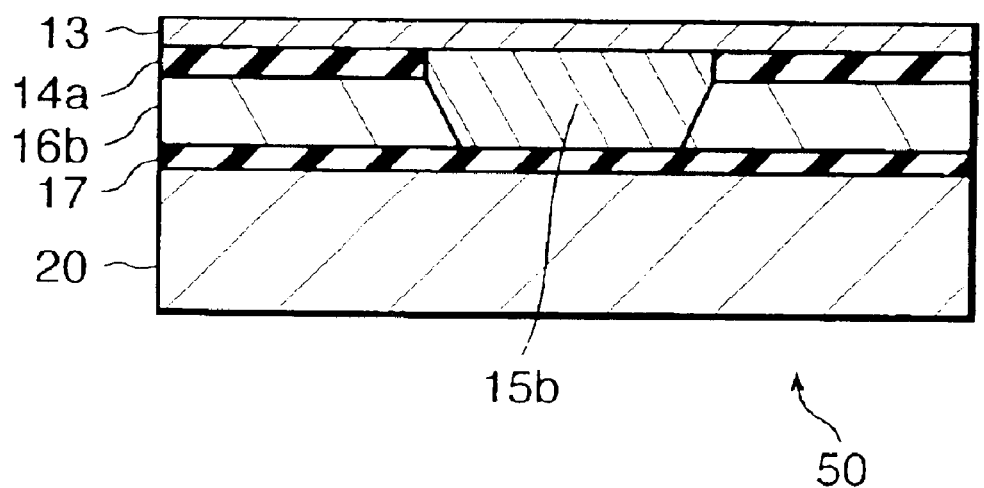
FIG. 2 is a view showing another structure of the substrate according to the preferred embodiment of the present invention.

When an insulating layer 17 is formed on the surface of the first substrate 10 prior to the step shown in FIG. 1H or when a substrate having the insulating layer 17 on its surface is adopted as the second substrate 20, a semiconductor substrate 50 as shown in FIG. 2 is finally obtained. The semiconductor substrate 50 shown in FIG. 2 has the partial insulating layer 14a under the single-crystal Si layer (first semiconductor layer) 13 and the full insulating layer 17 under and adjacent to or spaced apart from the partial insulating layer 14a. In the step shown in FIG. 1F or 1G, if the manufacturing conditions are determined such that the partial insulating layer 14a is exposed on the surface, the full insulating layer 17 is arranged under and adjacent to the partial insulating layer 14a. A region without the partial insulating layer 14a has an SOI layer (to be referred to as a thick-SOI region hereinafter) thicker than that of a region with the partial insulating layer 14a. With this structure, even a device which is formed in a region without the partial insulating layer 14a can be dielectrically isolated from bulk silicon.

EXAMPLES

Preferred examples of the present invention will be described below.

Example 1

First, a first single-crystal Si substrate 11 of p-type or n-type having a resistivity of 0.01 to 0.02 Ω·cm was prepared (this corresponds to the step shown in FIG. 1A).

Then, the single-crystal Si substrate 11 was anodized in an anodizing solution, thereby forming a porous Si layer serving as a separation layer 12. The anodizing conditions were as follows.

| | |
|---|---|
| Current density: | 7 (mA·cm$^{-2}$) |
| Anodizing solution: | HF:H$_2$O:C$_2$H$_5$OH = 1:1:1 |
| Time: | 11 (min) |
| Thickness of porous silicon portion: | 12 (μm) |

The current density and the concentrations of the respective components of the anodizing solution can appropriately be changed in accordance with the thickness, structure, and the like of the separation layer (porous Si layer) 12 to be formed. Preferably, the current density falls within the range of 0 to 700 mA/cm$^2$, and the ratio between the concentrations of the above components of the anodizing solution falls within the range of 1:10:10 to 1:0:0.

The porous Si layer is useful because a high-quality epitaxial Si layer is formed thereon and the porous Si layer functions as a separation layer. If the first and second substrates are bonded together to form a bonded substrate stack, and then the bonded substrate stack is ground to remove part of the first substrate, the porous Si layer need not be used as a separation layer.

The anodizing solution only needs to contain HF and need not contain ethanol. Ethanol, however, is useful for removing any air bubbles from the surface of the substrate and is preferably added to the anodizing solution. Examples of a chemical agent which has a function of removing air bubbles include, e.g., alcohols such as methyl alcohol and isopropyl alcohol, a surfactant, and the like in addition to ethanol. Instead of adding these chemical agents, air bubbles may be eliminated from the substrate surface by vibrations of ultrasonic waves or the like.

The thickness of the porous Si layer is not limited to the above example. Satisfactory results can be obtained as far as the thickness falls within the range of, e.g., several hundred μm to 0.1 μm.

The anodized substrate was oxidized in an oxygen atmosphere at 400° C. for 1 hr. With this oxidizing step, the inner walls of pores of the porous Si layer were covered with a thermal oxide film.

A single-crystal Si layer 13 having a thickness of 0.3 μm was epitaxially grown on the porous Si layer by chemical vapor deposition (CVD) (this corresponds to the step shown in FIG. 1C). The growth conditions were as follows.

| | |
|---|---|
| Source gas: | SiH$_2$Cl$_2$/H$_2$ |
| Gas flow rate: | 0.5/180 L/min |
| Gas pressure: | 80 Torr |

-continued

| Temperature: | 950° C. |
|---|---|
| Growth rate: | 0.3 µm/min |

Note that these growth conditions can appropriately be changed in accordance with required specifications of the single-crystal Si layer 13.

Prior to the epitaxial growth step, the substrate may be baked in an epitaxial reactor in a hydrogen atmosphere, and/or a minimum amount of silicon source may be supplied to the substrate in the epitaxial reactor. Then, the pores in the surface of the porous Si layer may be filled to planarize the substrate. By performing such an additional step, an epitaxial layer having a minimum defect density ($10^4$ cm$^{-2}$ or less) could be formed on the porous Si layer.

An $SiO_2$ layer 14 having a thickness of 200 nm was formed on the epitaxial Si layer 13 by thermal oxidation (this corresponds to the step shown in FIG. 1D).

A mask material (preferably, SiN or the like) was deposited on the oxide film and a resist was further applied to its surface. These materials were sequentially patterned such that an opening was formed in a non-SOI region (or a thick-SOI region). Since this example uses a bonding method (e.g., ELTRAN: a registered trademark) in which the first substrate and second substrate are bonded together, patterning must be so performed as to form a mirror image of a normal pattern.

If a mask material is not deposited on the $SiO_2$ layer 14, a resist is applied to the $SiO_2$ layer 14 and is patterned to form a resist pattern. Then, the $SiO_2$ layer 14 is etched through an opening of the resist pattern to expose the epitaxial Si layer 13.

On the other hand, if a mask material is deposited on the $SiO_2$ layer 14, a resist is applied to the mask material and is patterned to form a resist pattern. Then, the mask material is etched through an opening of the resist pattern, thereby performing patterning for the mask material. The $SiO_2$ layer 14 is etched through an opening of the mask material until the epitaxial Si layer 13 is exposed, thereby performing patterning for the $SiO_2$ layer 14. At this time, the resist may be removed after the patterning of the mask material and before the patterning of the $SiO_2$ layer 14.

When the resist and mask material were removed, a substrate in which the epitaxial Si layer 13 was partially exposed was obtained.

By performing the epitaxial growth step again, a second epitaxial Si layer 15 was formed on the first epitaxial Si layer 13. At the same time, a polysilicon layer 16 was formed on the $SiO_2$ layer 14a (this corresponds to the step shown in FIG. 1F). The thickness of the second epitaxial Si layer 15 can appropriately be determined in accordance with specifications required by a final semiconductor substrate. For example, the thickness can be set to 10 µm.

Then, the surface of the substrate was planarized by polishing (this corresponds to the step shown in FIG. 1G). As the polishing step, CMP may be performed. To remove any portion damaged by polishing in the polishing step, a cleaning step and/or etching step may further be performed.

The surface of a first substrate 10 and that of a second Si substrate 20 separately prepared were overlaid on and brought into contact with each other. After that, the both substrates were subjected to annealing in a nitrogen atmosphere or oxygen atmosphere at 1,100° C. for 1 hr to increase the bonding strength between the first substrate 10 and the second substrate 20 (this corresponds to the step shown in FIG. 1H). With this operation, a bonded substrate stack 30 was obtained.

If an oxide film is formed on at least one of the surface of the first substrate 10 and that of the second substrate 20, a region in which a second epitaxial Si layer 15b is grown becomes not a non-SOI region but a thick-SOI region (see FIG. 2). The thickness of the silicon film in the thick-SOI region can appropriately be determined in accordance with specifications required by a final semiconductor substrate. For example, the thickness can be set to 10 µm.

If an oxide film as described above is not formed, a region without any partial $SiO_2$ layer has not an SOI structure but the same structure as that of an epitaxial wafer (see FIG. 1K).

Pure water was injected from a 0.1-mm nozzle of a water jet apparatus toward a concave portion (concave portion formed by the beveled portions of the two substrates 10 and 20) of the periphery of the bonded substrate stack 30 in a direction parallel to the bonding interface of the bonded substrate stack 30 at a high pressure of 50 MPa. With this operation, the bonded substrate stack 30 was split at the separation layer 12 into two substrates (this corresponds to the step shown in FIG. 1I). The pressure of the pure water preferably falls within the range of, e.g., several MPa to 100 MPa.

In this splitting step, any one of the following operations may be performed.

(1) The nozzle performs scanning such that a jet of pure water injected from the nozzle moves along the concave portion formed by the beveled portions.

(2) The bonded substrate stack 30 is held by a wafer holder and rotates on its axis to inject pure water into the concave portion formed by the beveled portions around the periphery of the bonded substrate stack.

(3) The operations (1) and (2) are performed in combination.

Consequently, a polysilicon layer 16b, the partial $SiO_2$ layer 14a, the epitaxial Si layers 15b and 13, and a part 12b of the porous Si layer 12, which were originally formed on the side of the first substrate 10, were moved to the side of the second substrate 20. Only a porous Si layer 12a was left on the surface of the first substrate 10.

Instead of splitting the bonded substrate stack by a water jet method, a jet of gas may be used or a solid wedge may be inserted into the separation layer of the bonded substrate stack. Alternatively, a mechanical force such as a tensile force, shearing force, or the like may be applied to the bonded substrate stack or ultrasonic waves may be applied to the bonded substrate stack. In addition, any other method may be adopted.

Moreover, out of the two substrates constituting the bonded substrate stack, a portion from the back surface of the first base 10 to the porous Si layer may be removed by grinding, polishing, etching, or the like without splitting the bonded substrate stack, thereby exposing the entire surface of the porous silicon layer.

At this time, any one of the following operations may be performed.

(1) A portion from the exposed surface of the first substrate of the bonded substrate stack to the porous Si layer is continuously ground.

(2) A portion from the exposed surface of the first substrate of the bonded substrate stack is continuously ground until just before reaching the porous Si layer, and the remaining bulk silicon portion is removed by dry etching such as RIE or wet etching.

(3) A portion from the exposed surface of the first substrate of the bonded substrate stack is continuously ground until just before reaching the porous Si layer, and the remaining bulk silicon portion is removed by polishing.

The porous Si layer 12b which was moved to the uppermost surface of the second substrate 20 was selectively etched using an etchant in which at least a 49% hydrofluoric acid solution, a 30% hydrogen peroxide solution, and water are mixed (this corresponds to the step shown in FIG. 1J). The single-crystal Si layer 13 was left unetched. The porous Si layer 12b was selectively etched using the single-crystal Si layer 13 as an etch stopper and completely removed. If selective etching is performed while starting/stopping generating ultrasonic waves using an apparatus combined with a circulator and rotating a wafer, non-uniform etching in the surface and among substrates can be suppressed. Additionally, if alcohol or a surfactant is mixed with the etchant, unevenness in etching caused by gaseous reaction products on the surface can be suppressed.

The etching speed of a non-porous single-crystal Si layer with the etchant is extremely low, and the selectivity ratio to the etching speed of a porous layer reaches $10^5$ or more. The etching amount (about several ten Å) in a non-porous layer reduces the film thickness by a substantially negligible amount.

With the above-mentioned steps, a semiconductor substrate which has the single-crystal Si layer 13 with a thickness of 0.2 μm on the partial insulating layer 14a and single-crystal Si layer 15 in the partial insulating layer 14a was obtained. Although the porous Si layer was selectively etched, no change occurred in the single-crystal Si layer 13. When the film thickness of the formed single-crystal Si layer 13 was measured at 100 points across the surface, the uniformity of the film thickness was 201 nm±4 nm.

The observation of the cross section with a transmission electron microscope showed that the single-crystal Si layer 13 had no additional crystal defects and maintained good crystallinity.

Furthermore, the substrate was subjected to annealing (hydrogen annealing) in a hydrogen atmosphere at 1,100° C. for 1 hr, and the surface roughness was evaluated with an atomic force microscope. The rootmean-square roughness in a 50-μm-square region was about 0.2 nm, which was equivalent to that of a commercially available silicon wafer.

The surface may be planarized by polishing such as CMP, instead of hydrogen annealing.

If plasma processing is performed for at least one of respective surfaces to be bonded of the first and second substrates as a preprocess of the bonding step, the bonding strength can be increased even by annealing at a low temperature. Additionally, a substrate having undergone plasma processing is preferably rinsed by pure water.

In the splitting step, a plurality of bonded substrate stacks may be arranged in their planar direction, and a nozzle of a water jet apparatus may perform scanning along the planar direction, thereby continually splitting the plurality of bonded substrate stacks.

Alternatively, a plurality of bonded substrate stacks may be arranged in a direction perpendicular to each plane, and a nozzle of a water jet apparatus may be provided with an X-Y scanning function. Then, a jet of water may sequentially be injected toward a plurality of bonding portions of the bonded substrate stack, and the bonded substrate stacks may automatically and continually be split.

The single-crystal Si layer 13 and second semiconductor layer 15b may be made of, e.g., SiGe, GaAs, SiC, C, or the like, instead of single-crystal silicon.

As the second substrate 20, a substrate made of, e.g., quartz, sapphire, ceramic, carbon, SiC, or the like may be adopted, in addition to an Si substrate.

Example 2

This example is an improved example of the example 1 and is the same as the example 1 except for anodizing conditions.

In this example, a single-crystal Si substrate 11 was prepared and anodized in a solution containing HF under either of the following anodizing conditions.

| (First Anodizing Condition) (First Step) | |
|---|---|
| Current density: | 8 (mA · cm$^{-2}$) |
| Anodizing solution: | HF:H$_2$O:C$_2$H$_5$OH = 1:1:1 |
| Time: | 11 (min) |
| Thickness of porous silicon portion: | 13 (μm) |
| (Second Step) | |
| Current density: | 22 (mA · cm$^{-2}$) |
| Anodizing solution: | HF:H$_2$O:C$_2$H$_5$OH = 1:1:1 |
| Time: | 2 (min) |
| Thickness of porous silicon portion: | 3 (μm) |
| or | |
| (Second Anodizing Condition) (First Step) | |
| Current density: | 8 (mA · cm) |
| Anodizing solution: | HF:H$_2$O:C$_2$H$_5$OH = 1:1:1 |
| Time: | 5 (min) |
| Thickness of porous silicon portion: | 6 (μm) |
| (Second Step) | |
| Current density: | 33 (mA · cm$^{-2}$) |
| Anodizing solution: | HF:H$_2$O:C$_2$H$_5$OH = 1:1:1 |
| Time: | 1.3 (min) |
| Thickness of porous silicon portion: | 3 (μm) |

The first porous Si layer to be formed at the first step of the anodization is used to form a high-quality epitaxial Si layer thereon. The second porous Si layer to be formed under the first porous Si layer at the second step of the anodization is used as a separation layer. Note that if the first substrate is removed by grinding a bonded substrate stack, a porous Si layer is not used as a separation layer.

The position of a separation surface (a surface to be separated) was limited to the vicinity of the interface between the first porous Si layer and second porous Si layer. This was effective in planarization of the separation surface.

Example 3

A DRAM having a trench capacitor was formed in the non-SOI region of a semiconductor substrate which was manufactured by each of the methods described in the examples 1 and 2 and had a structure shown in FIG. 1K. Other devices including a logic circuit were formed in the SOI region. The methods described in the examples 1 and 2 are bonding methods, and the surface of a semiconductor substrate to be manufactured is flat. For this reason, in the lithography step, the entire region of exposure shots fell within the focus-range of the depth of a projection optical system, and no local defocusing (defocusing due to unevenness of the surface of the substrate) occurred. Since a single-crystal Si layer having a sufficient thickness was formed in the non-SOI region, no trouble occurred in forming the trench capacitor.

Additionally, the above semiconductor substrate is effectively used to form an integrated circuit other than a DRAM-embedded one.

Other Example

Various film forming techniques such as CVD, MBE, sputtering, liquid phase growth can be applied to the epitaxial growth step for forming the first semiconductor layer and the second semiconductor layer.

Also, various other etchants (e.g., a mixture of a hydrofluoric acid solution, nitric acid solution, and acetic acid solution) can be applied to the step of selectively etching a separation layer (porous layer, ion implantation layer, or the like) left upon splitting, in addition to a mixture of a 49% hydrofluoric acid solution, a 30% hydrogen peroxide solution, and water as described above.

The present invention can, e.g., ensure the advantages of an SOI substrate for a substrate having a partial insulating layer under a semiconductor layer.

Second Embodiment

A preferred embodiment of the present invention will be described with reference to the accompanying drawings.

FIGS. 3A to 3L are views for explaining a substrate manufacturing method according to the second embodiment of the present invention. In the step shown in FIG. 3A, a single-crystal Si substrate (seed substrate) 11 is prepared, and in the step shown in FIG. 3B, a separation layer 12 is formed on the surface of the single-crystal Si substrate 11. As the separation layer 12, e.g., a porous layer which can be formed by anodizing the surface of the single-crystal Si substrate 11 is preferably employed. This anodization can be performed by, e.g., placing an anode and cathode in an electrolyte solution containing hydrofluoric acid, placing the single-crystal Si substrate 11 between the electrodes, and supplying a current between them. The porous layer may comprise two or more layers with different porosities.

Figure 3A:
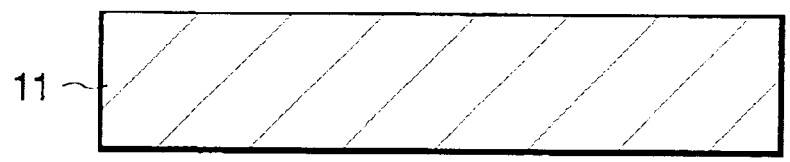
FIGS. 3A to 3K are views for explaining a substrate manufacturing method according to another preferred embodiment of the present invention.
Figure 3B:
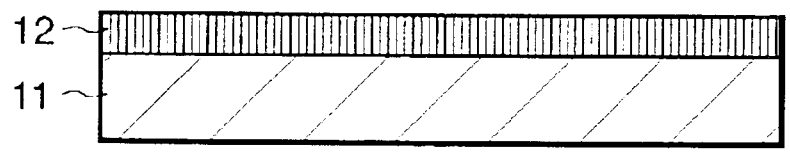
Figure 3C:
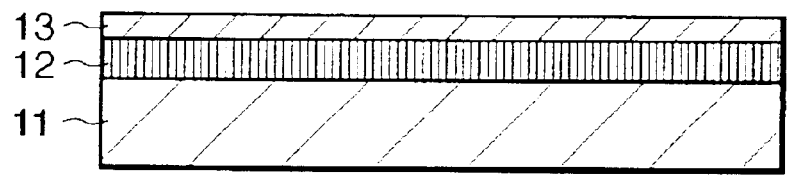

In the step shown in FIG. 3C, a single-crystal Si layer (first semiconductor layer) 13 is formed on the separation layer 12 by epitaxial growth. Epitaxial growth can form the single-crystal Si layer 13 of good quality.

Instead of the method shown in FIGS. 3B and 3C, e.g., a method of implanting ions such as hydrogen ions or the like at a predetermined depth from the surface of the single-crystal Si substrate 11 shown in FIG. 3A to form an ion implantation layer serving as the separation layer 12 may be adopted. In this case, a portion on the surface side from the viewpoint of the separation layer 12 functions as the single-crystal Si layer 13. Although an example in which a single-crystal Si layer is formed on the separation layer 12 will mainly be explained here, a semiconductor layer made of another material may be formed on the separation layer 12.

Figure 3D:
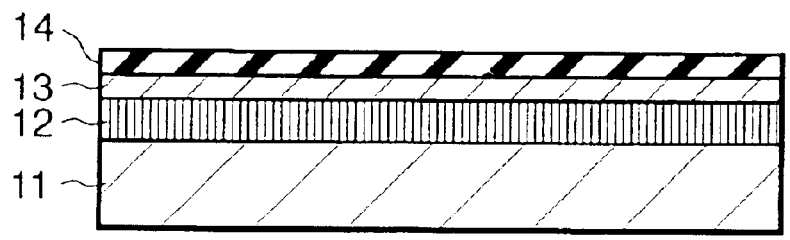

In the step shown in FIG. 3D, an $SiO_2$ layer 14 serving as an insulating layer is formed on the single-crystal Si layer 13. The $SiO_2$ layer 14 can be formed by, e.g., thermal oxidation. Thermal oxidation can form an $SiO_2$ layer of good quality.

Figure 3E:
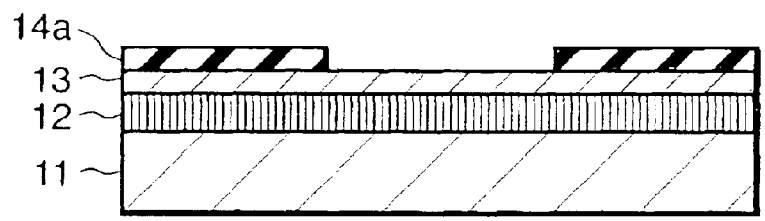

In the step shown in FIG. 3E, the $SiO_2$ layer 14 is patterned to form a partial $SiO_2$ layer 14a. A partial $SiO_2$ layer is defined as an $SiO_2$ layer which is formed such that the single-crystal Si layer (semiconductor layer) 13 is at least partially exposed. The $SiO_2$ layer 14 can be patterned by, e.g., the following operation. After a mask material is formed on the $SiO_2$ layer 14, the mask material is patterned by lithography (resist coating, exposure, development, and etching) to form an opening. The $SiO_2$ layer 14 exposed at the bottom of the opening is then etched by, e.g., reactive ion etching (RIE).

Instead of the steps shown in FIGS. 3D and 3E, e.g., a step of covering the surface except a region in which the partial $SiO_2$ layer 14a is to be formed with a mask pattern and forming the partial $SiO_2$ layer 14a only in an exposed portion may be adopted.

Figure 3F:
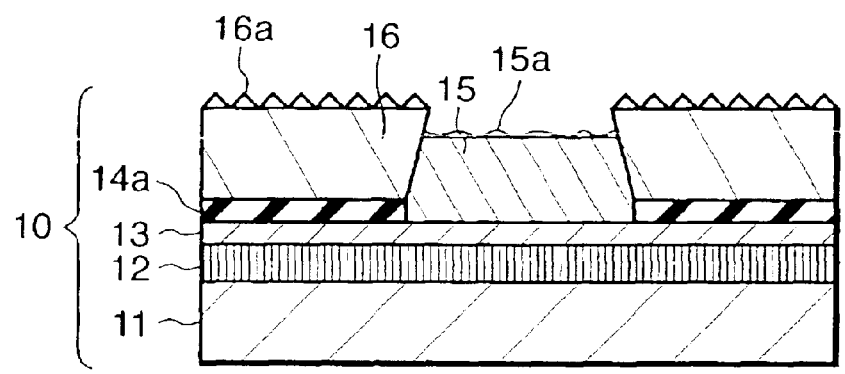

In the step shown in FIG. 3F, a single-crystal Si layer (second semiconductor layer) 15 is grown by epitaxial growth on an exposed portion of the single-crystal Si layer 13 in the partial $SiO_2$ layer 14a. At this time, a polysilicon layer 16 may be formed on the partial insulating layer 14a.

Typically, the single-crystal Si layer 15 and polysilicon layer 16 are different in growth rate, and a level difference may occur between the single-crystal Si layer 15 and the polysilicon layer 16, as exaggeratedly shown in FIG. 3F. Three-dimensional patterns 15a and 16a can be formed on the surfaces of the single-crystal Si layer 15 and polysilicon layer 16, respectively.

Assume that in the step shown in FIG. 3C, a semiconductor layer made of another material is formed instead of the single-crystal Si layer 13. In this case, a semiconductor layer made of the same material as that of the formed semiconductor layer is preferably formed on the semiconductor layer in the step shown in FIG. 3F.

In this manner, a first substrate 10 is so formed as to have the single-crystal Si layer (first semiconductor layer) 13 on the porous layer or ion implantation layer as the separation layer 12, the partial $SiO_2$ layer (insulating layer) 14a on the single-crystal Si layer 13, and a single-crystal Si layer (second semiconductor layer) 15b on the single-crystal Si layer 13 and a polysilicon layer (second semiconductor layer) 16b on the insulating layer 14a. Although a substrate having a structure shown in FIG. 3F is referred to as the first substrate for the sake of convenience, a substrate having a structure shown in any one of FIGS. 3A to 3E, 3G, and 3H may also be referred to as the first substrate.

Figure 3G:
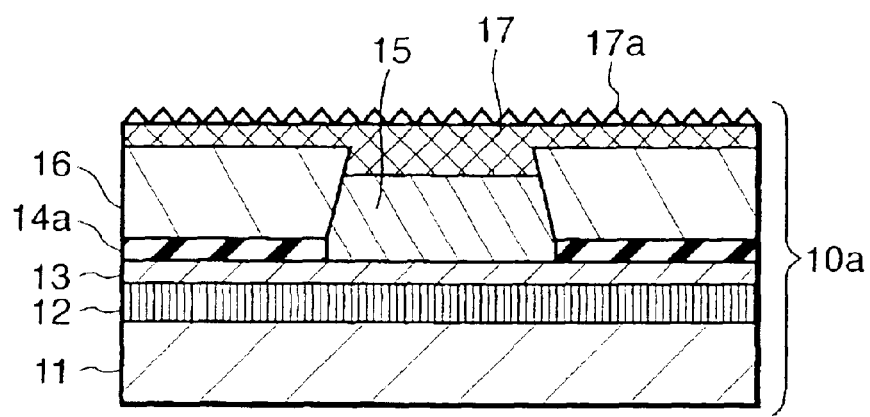

In the step shown in FIG. 3G, a third layer 17 is formed on the single-crystal Si layer 15 and polysilicon layer 16, i.e., the entire surface of the first substrate 10. The third layer preferably has a substantially uniform structure (structure which can uniformly be polished) to facilitate planarization in the subsequent planarizing step. The third layer 17 may comprise a semiconductor layer or a layer made of a material other than a semiconductor material. As the third layer 17, e.g., a polysilicon layer, an amorphous Si layer, an oxide film (e.g., an $SiO_2$ layer formed by CVD or the like), a PSG layer, a BPSG layer, or the like is preferably used. If an $SiO_2$ layer is to be formed as the third layer 17, the $SiO_2$ layer may be formed by thermal oxidation, but CVD is more preferable. This is because thermal oxidation reflects the shape of an underlying layer in the surface shape of the $SiO_2$ layer while CVD tends to make the underlying layer have a more gently stepped surface.

The formation of the third layer 17 can planarize the surface of a first substrate 10a. This contributes to an increase in bonding strength between the first and second substrates and ease of bonding, in the subsequent bonding step. The formation of the third layer 17 is also effective in keeping the single-crystal Si layers 13 and 15 finally serving as active layers away from the second substrate to be bonded to the first substrate.

To improve the planarity of the surface of the first substrate 10a, the surface of the first substrate 10 (see FIG. 3F), in which the single-crystal Si layer 15 and polysilicon layer 16 are combined, is preferably planarized by polishing, grinding, or the like before forming the third layer 17. In this case, the planarizing step need not be performed after the formation of the third layer 17.

Figure 3H:
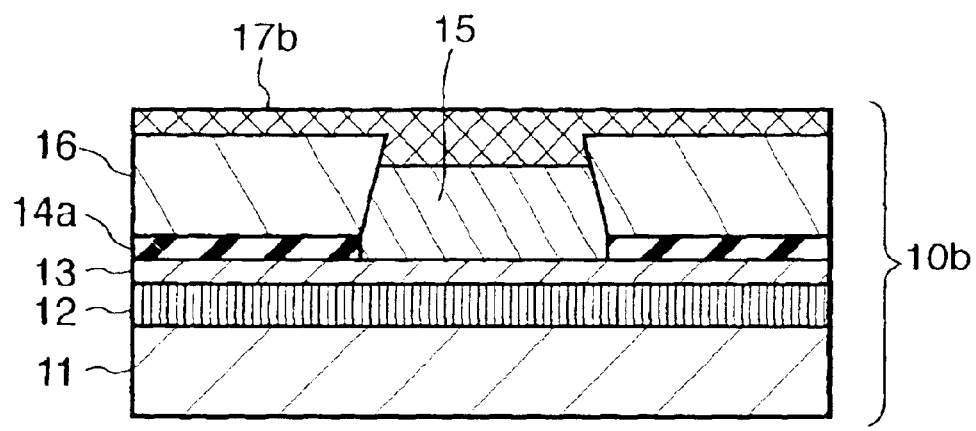

The step shown in FIG. 3H is a step performed when a three-dimensional pattern 17a on the surface of the first substrate 10a (see FIG. 3G) is inadmissibly uneven. The surface of the first substrate 10a is planarized by polishing, grinding, or the like. With this planarization of the third layer 17, the bonding strength between the first and second substrates and ease of bonding in the subsequent bonding step can further be increased.

In the first embodiment, the step of planarizing the surface of the first substrate 10, in which the single-crystal Si layer 15 and polysilicon layer 16 are combined, is performed without performing the formation step shown in FIG. 3G. Immediately after that, the first substrate is bonded to the second substrate. However, when the first substrate is required to have good planarity or to facilitate the planarization of the first substrate, the second embodiment with the third layer is more preferable than the first embodiment without the third layer. More specifically, even if the planarizing step is performed for the surface of the first substrate 10, in which the single-crystal Si layer 15 and polysilicon layer 16 are combined, it is difficult to obtain good planarity. For example, the planarizing step suitable for the single-crystal Si layer 15 does not impart good planarity to the polysilicon layer 16 while the planarizing step suitable for the polysilicon layer 16 does not impart good planarity to the single-crystal Si layer 15. Additionally, a level difference may occur between the single-crystal Si layer 15 and polysilicon layer 16.

Figure 3I:
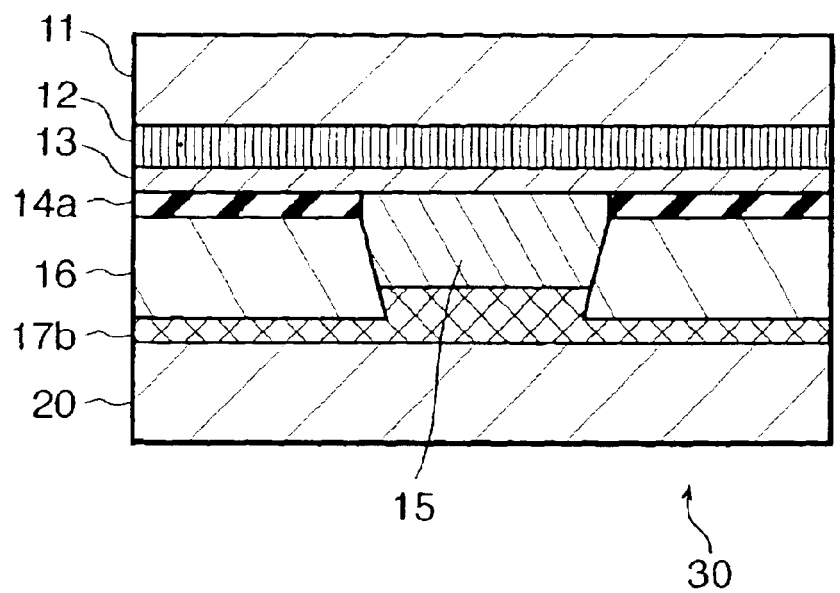

In the step shown in FIG. 3I, a second substrate (handle substrate) 20 is bonded to the surface (a third layer 17b) of a first substrate 10b shown in FIG. 3H to form a bonded substrate stack 30. An $SiO_2$ layer (insulating layer) may be formed on the surface of the first substrate 10 as the fourth layer by, e.g., thermal oxidation, prior to the bonding (except in cases in which the third layer comprises an insulting film such as an $SiO_2$ layer). As the second substrate 20, a single-crystal Si substrate or a substrate obtained by forming an insulating layer such as an $SiO_2$ layer on the surface can typically be used. However, any other substrate such as an insulating substrate (e.g., a glass substrate) may be adopted as the second substrate 20.

Figure 3J:
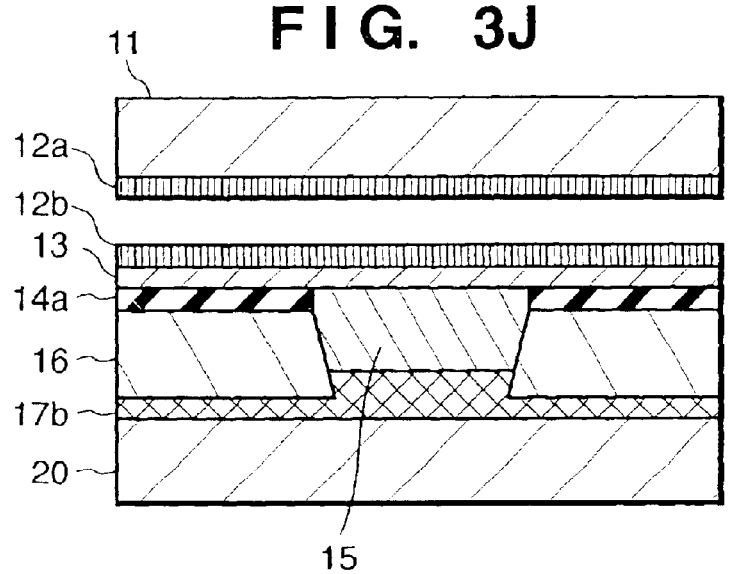

In the step shown in FIG. 3J, the bonded substrate stack 30 is split into two substrates by splitting the bonded substrate stack 30 at the separation layer 12. This splitting can be performed by, e.g., using a fluid. As a method of using a fluid, a method of forming a jet of a fluid (liquid or gas) and injecting it to the separation layer 12, a method of utilizing the static pressure of a fluid, or the like is preferably used. Among these methods, a method of utilizing water as a fluid is referred to as a water jet method. The above-mentioned splitting can also be performed by, e.g., annealing the bonded substrate stack 30. Such splitting by annealing is particularly effective in forming an ion implantation layer as the separation layer 12. Additionally, the splitting can be performed by, e.g., inserting a member such as a solid wedge into the separation layer 12.

In addition to the above-mentioned splitting methods, a grinding and polishing method in which the back surface (exposed surface) of the bonded substrate stack 30 is ground and polished to leave a single-crystal Si layer with a predetermined thickness on the insulating layer 14a may be adopted. In this case, the separation layer 12 need not be formed in advance.

Figure 3K:
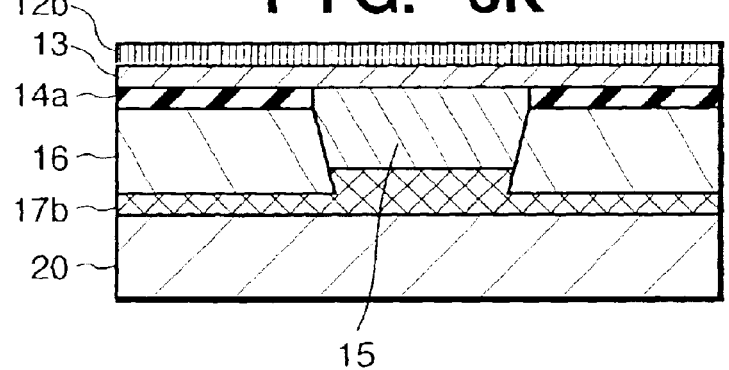

In the step shown in FIG. 3K, a separation layer 12b left on the single-crystal Si layer 13 of the second substrate 20 is removed using an etchant or the like. At this time, the single-crystal Si layer 13 can be used as an etching stopper layer. Then, the surface of the substrate may be planarized by performing a planarizing step such as a hydrogen annealing step, polishing step, or the like, as needed.

Figure 3L:
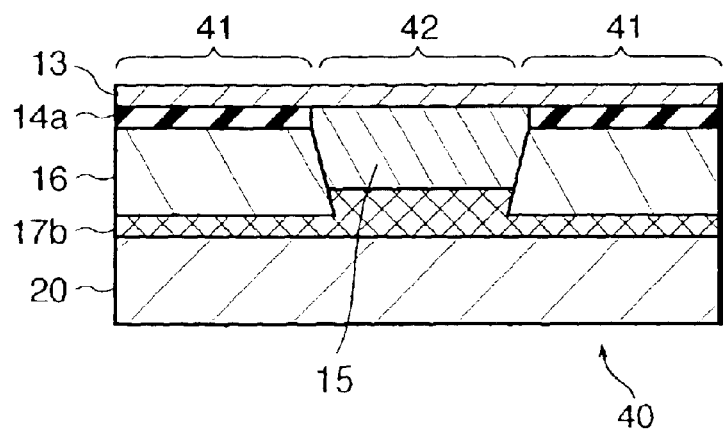
FIG. 3L is a view showing the structure of a substrate according to the preferred embodiment of the present invention.

With the above-mentioned method, a semiconductor substrate (partial SOI substrate) 40 as shown in FIG. 3L is obtained. The semiconductor substrate 40 shown in FIG. 3L has the thin single-crystal Si layer (first semiconductor layer) 13 on its surface, the partial $SiO_2$ layer (insulating layer) 14a and single-crystal Si layer 15 under the single-crystal Si layer 13, and the third layer 17b under the partial $SiO_2$ layer 14a and single-crystal Si layer 15. A thin single-crystal Si layer means a layer thinner than a general semiconductor substrate. To exhibit the advantages of an SOI substrate, the thickness of the single-crystal Si layer (first semiconductor layer) 13 is preferably, e.g., 10 $\mu$m or less, and more preferably, 5 nm to 2 $\mu$m.

A region (SOI region) 41 with the partial $SiO_2$ layer (insulating layer) 14a as a buried insulating layer out of the semiconductor substrate 40 has the same properties as those of an SOI substrate which has a buried insulating film over the whole region. If the third layer 17b does not comprise an insulating layer such as an $SiO_2$ layer, a region (non-SOI region) 42 without the partial insulating layer 14a out of the semiconductor substrate 40, i.e., a region which has the single-crystal Si layer 15 under the single-crystal Si layer 13 has substantially the same properties as those of an Si substrate which has an epitaxial Si layer on its surface. The single-crystal Si layer 15 is a layer which is formed by epitaxial growth using as the underlying layer the single-crystal Si layer 13 formed by epitaxial growth. For this reason, a defect hardly occurs in the interface between the single-crystal Si layer 13 and the single-crystal Si layer 15. Accordingly, if the semiconductor substrate 40 is used, a high-quality device can be formed even when a device (e.g., a trench capacitor) having a structure deeper than that of a device to be formed in the SOI region is formed in the non-SOI region.

If the third layer 17b comprises an insulating layer such as an $SiO_2$ layer, the semiconductor substrate 40 has the partial insulating layer 14a under the single-crystal Si layer (first semiconductor layer) 13 and an insulating layer as the third layer 17b over the whole region under the partial insulating layer 14a (in the internal direction of the substrate). A region without the partial insulating layer 14a has an SOI layer (this region is to be referred to as a thick-SOI region hereinafter) thicker than that of a region with the partial insulating layer 14a.

The semiconductor substrate 40 which can be manufactured by this embodiment is useful in forming a logic circuit in the SOI region 41 and forming a DRAM which has a trench-type capacitor in the non-SOI region 42. Alternatively, the semiconductor substrate 40 is useful in forming a memory cell transistor of a DRAM and a logic circuit on the SOI region 41 and forming a memory cell capacitor of the DRAM in the non-SOI region 42. Examples of the thicknesses of the single-crystal Si layer in the SOI and non-SOI regions in the semiconductor substrate 40 used to form a DRAM will be given. The single-crystal Si layer has a thickness of about 100 nm in the SOI region while it has a thickness of about several $\mu$m to 10 $\mu$m in the non-SOI region.

Figure 4:
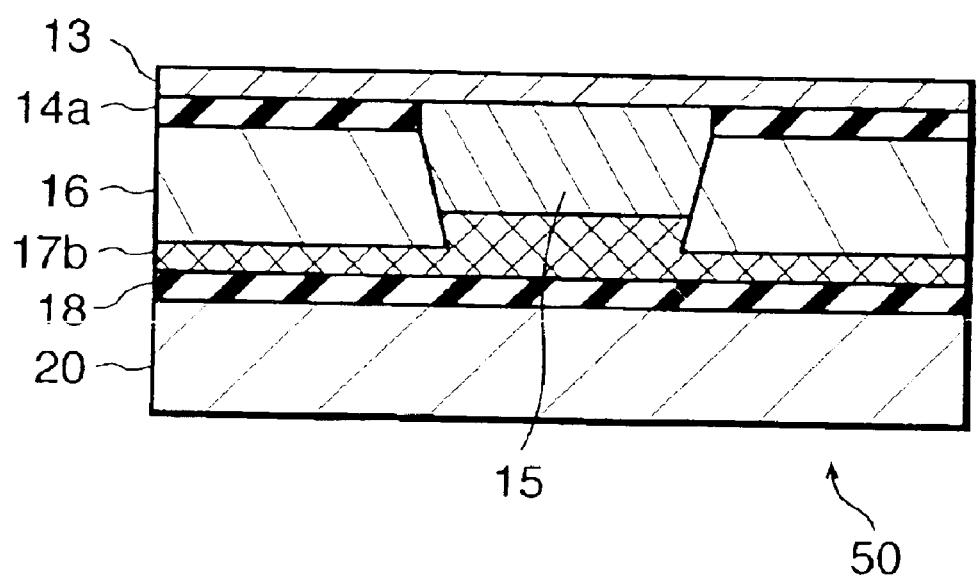
FIG. 4 is a view showing another structure of the substrate according to the preferred embodiment of the present invention.

When an insulating layer 18 is formed as the fourth layer on the surface of the first substrate 10 prior to the step shown in FIG. 3I or when a substrate having the insulating layer 18 on its surface is adopted as the second substrate 20, a semiconductor substrate 50 as shown in FIG. 4 is finally obtained. The semiconductor substrate 50 shown in FIG. 4 has the partial insulating layer 14a under the single-crystal Si layer (first semiconductor layer) 13, the third layer 17b under the partial insulating layer 14a (in the internal direction of the substrate), and the insulating layer 18 under the third layer 17b. A region without the partial insulating layer 14a has an SOI layer (thick-SOI region) thicker than that of a region with the partial insulating layer 14a.

EXAMPLES

Preferred examples of the present invention will be described below.

Example 1

First, a first single-crystal Si substrate 11 of p-type or n-type having a resistivity of 0.01 to 0.02 Ω·cm was prepared (this corresponds to the step shown in FIG. 3A).

Then, the single-crystal Si substrate 11 was anodized in an anodizing solution, thereby forming a porous Si layer serving as a separation layer 12. The anodizing conditions were as follows.

| | |
|---|---|
| Current density: | 7 (mA · cm$^{-2}$) |
| Anodizing solution: | HF:H$_2$O:C$_2$H$_5$OH = 1:1:1 |
| Time: | 11 (min) |
| Thickness of porous silicon portion: | 12 (μm) |

The current density and the concentrations of the respective components of the anodizing solution can appropriately be changed in accordance with the thickness, structure, and the like of the separation layer (porous Si layer) 12 to be formed. Preferably, the current density falls within the range of 0 to 700 mA/cm$^2$, and the ratio between the concentrations of the above components of the anodizing solution falls within the range of 1:10:10 to 1:0:0.

The porous Si layer is useful because a high-quality epitaxial Si layer is formed thereon and the porous Si layer functions as a separation layer. If the first and second substrates are bonded together to form a bonded substrate stack, and then the bonded substrate stack is ground to remove part of the first substrate, the porous Si layer need not be used as a separation layer.

The anodizing solution only needs to contain HF and need not contain ethanol. Ethanol, however, is useful for removing any air bubbles from the surface of the substrate and is preferably added to the anodizing solution. Examples of a chemical agent which has a function of removing air bubbles include, e.g., alcohols such as methyl alcohol and isopropyl alcohol, a surfactant, and the like in addition to ethanol. Instead of adding these chemical agents, air bubbles may be eliminated from the substrate surface by vibrations of ultrasonic waves or the like.

The thickness of the porous Si layer is not limited to the above example. Satisfactory results can be obtained as far as the thickness falls within the range of, e.g., several hundred μm to 0.1 μm.

The anodized substrate was oxidized in an oxygen atmosphere at 400° C. for 1 hr. With this oxidizing step, the inner walls of pores of the porous Si layer were covered with a thermal oxide film.

A single-crystal Si layer 13 having a thickness of 0.3 μm was epitaxially grown on the porous Si layer by chemical vapor deposition (CVD) (this corresponds to the step shown in FIG. 3C). The growth conditions were as follows.

| | |
|---|---|
| Source gas: | SiH$_2$Cl$_2$/H$_2$ |
| Gas flow rate: | 0.5/180 L/min |
| Gas pressure: | 80 Torr |
| Temperature: | 950°C. |
| Growth rate: | 0.3 μm/min |

Note that these growth conditions can appropriately be changed in accordance with required specifications of the single-crystal Si layer 13.

Prior to the epitaxial growth step, the substrate may be baked in an epitaxial reactor in a hydrogen atmosphere, and/or a minimum amount of silicon source may be supplied to the substrate in the epitaxial reactor. Then, the pores in the surface of the porous Si layer may be filled to planarize the substrate. By performing such an additional step, an epitaxial layer having a minimum defect density (10$^4$ cm$^{-2}$ or less) could be formed on the porous Si layer.

An SiO$_2$ layer 14 having a thickness of 200 nm was formed on the epitaxial Si layer 13 by thermal oxidation (this corresponds to the step shown in FIG. 3D).

A mask material (preferably, SiN or the like) was deposited on the oxide film and a resist was further applied to its surface. These materials were sequentially patterned such that an opening was formed in a non-SOI region (or a thick-SOI region). Since this example uses a bonding method (e.g., ELTRAN: a registered trademark) in which the first substrate and second substrate are bonded together, patterning must be so performed as to form a mirror image of a normal pattern.

If a mask material is not deposited on the SiO$_2$ layer 14, a resist is applied to the SiO$_2$ layer 14 and is patterned to form a resist pattern. Then, the SiO$_2$ layer 14 is etched through an opening of the resist pattern to expose the epitaxial Si layer 13.

On the other hand, if a mask material is deposited on the SiO$_2$ layer 14, a resist is applied to the mask material and is patterned to form a resist pattern. Then, the mask material is etched through an opening of the resist pattern, thereby performing patterning for the mask material. The SiO$_2$ layer 14 is etched through an opening of the mask material until the epitaxial Si layer 13 is exposed, thereby performing patterning for the SiO$_2$ layer 14. At this time, the resist may be removed after the patterning of the mask material and before the patterning of the SiO$_2$ layer 14.

When the resist and mask material were removed, a substrate in which the epitaxial Si layer 13 was partially exposed was obtained.

By performing the epitaxial growth step again, a second epitaxial Si layer 15 was formed on the first epitaxial Si layer 13. At the same time, a polysilicon layer 16 was formed on the SiO$_2$ layer 14a (this corresponds to the step shown in FIG. 3F). The thickness of the second epitaxial Si layer 15 can appropriately be determined in accordance with specifications required by a final semiconductor substrate. For example, the thickness can be set to 10 μm.

A polysilicon layer having a thickness of 3 μm was grown as a third layer 17 on the entire surface of a first substrate 10 (this corresponds to the step shown in FIG. 3G). The thickness of the third layer can be changed in accordance with required planarity or the like of the first substrate. As the third layer 17, an insulating layer such as an amorphous Si layer, an oxide film (e.g., an SiO$_2$ layer formed by CVD or the like), a PSG layer, a BPSG layer, or the like in addition to a polysilicon layer is preferably used. An insulating layer such as an $SiO_2$ layer may be formed as the fourth layer on the third layer 17 (except in cases in which the third layer comprises an insulting layer).

Then, the surface (third layer 17) of a first substrate 10a was planarized by polishing (this corresponds to the step shown in FIG. 3H). As the polishing step, CMP may be performed. To remove any portion damaged by polishing in the polishing step, a cleaning step and/or etching step may further be performed.

The surface of a first substrate 10b and that of a second Si substrate 20 separately prepared were overlaid on and brought into contact with each other. After that, the both substrates were subjected to annealing in a nitrogen atmosphere or oxygen atmosphere at 1,100° C. for 1 hr to increase the bonding strength between the first substrate 10 and the second substrate 20 (this corresponds to the step shown in FIG. 3I). With this operation, a bonded substrate stack 30 was obtained.

If the third layer of the first substrate 10 comprises an insulating layer, if an insulating layer is formed as the fourth layer on the third layer, or if at least the surface of the second substrate 20 comprises an insulator, a region in which a second epitaxial Si layer 15b is grown becomes not a non-SOI region but a thick-SOI region (see FIG. 4). The thickness of the silicon film in the thick-SOI region can appropriately be determined in accordance with specifications required by a final semiconductor substrate. For example, the thickness can be set to 10 $\mu$m.

If an oxide film as described above is not formed, a region without any partial $SiO_2$ layer has not an SOI structure but the same structure as that of an epitaxial wafer (see FIG. 3L).

Pure water was injected from a 0.1-mm nozzle of a water jet apparatus toward a concave portion (concave portion formed by the beveled portions of the two substrates 10 and 20) of the periphery of the bonded substrate stack 30 in a direction parallel to the bonding interface of the bonded substrate stack 30 at a high pressure of 50 MPa. With this operation, the bonded substrate stack 30 was split at the separation layer 12 into two substrates (this corresponds to the step shown in FIG. 3J). The pressure of the pure water preferably falls within the range of, e.g., several MPa to 100 MPa.

In this splitting step, any one of the following operations may be performed.

(1) The nozzle performs scanning such that a jet of pure water injected from the nozzle moves along the concave portion formed by the beveled portions.

(2) The bonded substrate stack 30 is held by a wafer holder and rotates on its axis to inject pure water into the concave portion formed by the beveled portions around the periphery of the bonded substrate stack.

(3) The operations (1) and (2) are performed in combination.

Consequently, a third layer 17b, the polysilicon layer 16, the partial $SiO_2$ layer 14a, the epitaxial Si layers 15 and 13, and a part 12b of the porous Si layer 12, which were originally formed on the side of the first substrate 10, were moved to the side of the second substrate 20. Only a porous Si layer 12a was left on the surface of the first substrate 10.

Instead of splitting the bonded substrate stack by a water jet method, a jet of gas may be used or a solid wedge may be inserted into the separation layer of the bonded substrate stack. Alternatively, a mechanical force such as a tensile force, shearing force, or the like may be applied to the bonded substrate stack or ultrasonic waves may be applied to the bonded substrate stack. In addition, any other method may be adopted.

Moreover, out of the two substrates constituting the bonded substrate stack, a portion from the back surface of the first base 10 to the porous Si layer may be removed by grinding, polishing, etching, or the like without splitting the bonded substrate stack, thereby exposing the entire surface of the porous silicon layer.

At this time, any one of the following operations may be performed.

(1) A portion from the exposed surface of the first substrate of the bonded substrate stack to the porous Si layer is continuously ground.

(2) A portion from the exposed surface of the first substrate of the bonded substrate stack is continuously ground until just before reaching the porous Si layer, and the remaining bulk silicon portion is removed by dry etching such as RIE or wet etching.

(3) A portion from the exposed surface of the first substrate of the bonded substrate stack is continuously ground until just before reaching the porous Si layer, and the remaining bulk silicon portion is removed by polishing.

The porous Si layer 12b which was moved to the uppermost surface of the second substrate 20 was selectively etched using an etchant in which at least a 49% hydrofluoric acid solution, a 30% hydrogen peroxide solution, and water are mixed (this corresponds to the step shown in FIG. 3K). The single-crystal Si layer 13 was left unetched. The porous Si layer 12b was selectively etched using the single-crystal Si layer 13 as an etch stopper and completely removed. If selective etching is performed while starting/stopping generating ultrasonic waves using an apparatus combined with a circulator and rotating a wafer, non-uniform etching in the surface and among substrates can be suppressed. Additionally, if alcohol or a surfactant is mixed with the etchant, unevenness in etching caused by gaseous reaction products on the surface can be suppressed.

The etching speed of a non-porous single-crystal Si layer with the etchant is extremely low, and the selectivity ratio to the etching speed of a porous layer reaches $10^5$ or more. The etching amount (about several ten Å) in a non-porous layer reduces the film thickness by a substantially negligible amount.

With the above-mentioned steps, a semiconductor substrate which has the single-crystal Si layer 13 with a thickness of 0.2 $\mu$m on the partial insulating layer 14a and single-crystal Si layer 15 in the partial insulating layer 14a was obtained. Although the porous Si layer was selectively etched, no change occurred in the single-crystal Si layer 13. When the film thickness of the formed single-crystal Si layer 13 was measured at 100 points across the surface, the uniformity of the film thickness was 201 nm±4 nm.

The observation of the cross section with a transmission electron microscope showed that the single-crystal Si layer 13 had no additional crystal defects and maintained good crystallinity.

Furthermore, the substrate was subjected to annealing (hydrogen annealing) in a hydrogen atmosphere at 1,100° C. for 1 hr, and the surface roughness was evaluated with an atomic force microscope. The rootmean-square roughness in a 50-$\mu$m-square region was about 0.2 nm, which was equivalent to that of a commercially available silicon wafer.

The surface may be planarized by polishing such as CMP, instead of hydrogen annealing.

If plasma processing is performed for at least one of respective surfaces to be bonded of the first and second substrates as a preprocess of the bonding step, the bonding strength can be increased even by annealing at a low temperature. Additionally, a substrate having undergone plasma processing is preferably rinsed by pure water.

In the splitting step, a plurality of bonded substrate stacks may be arranged in their planar direction, and a nozzle of a water jet apparatus may perform scanning along the planar direction, thereby continually splitting the plurality of bonded substrate stacks.

Alternatively, a plurality of bonded substrate stacks may be arranged in a direction perpendicular to each plane, and a nozzle of a water jet apparatus may be provided with an X-Y scanning function. Then, a jet of water may sequentially be injected toward a plurality of bonding portions of the bonded substrate stack, and the bonded substrate stacks may automatically and continually be split.

The single-crystal Si layer 13 and second semiconductor layer 15 may be made of, e.g., SiGe, GaAs, SiC, C, or the like, instead of single-crystal silicon.

As the second substrate 20, a substrate made of, e.g., quartz, sapphire, ceramic, carbon, SiC, or the like may be adopted, in addition to an Si substrate.

Example 2

This example is an improved example of the example 1 and is the same as the example 1 except for anodizing conditions.

In this example, a single-crystal Si substrate 11 was prepared and anodized in a solution containing HF under either of the following anodizing conditions.

| (First Anodizing Condition) | |
|---|---|
| (First Step) | |
| Current density: | 8 (mA · cm$^{-2}$) |
| Anodizing solution: | HF:H$_2$O:C$_2$H$_5$OH = 1:1:1 |
| Time: | 11 (min) |
| Thickness of porous silicon portion: | 13 ($\mu$m) |
| (Second Step) | |
| Current density: | 22 (mA · cm$^{-2}$) |
| Anodizing solution: | HF:H$_2$O:C$_2$H$_5$OH = 1:1:1 |
| Time: | 2 (min) |
| Thickness of porous silicon portion: | 3 ($\mu$m) |
| or | |

| (Second Anodizing Condition) | |
|---|---|
| (First Step) | |
| Current density: | 8 (mA · cm$^{-2}$) |
| Anodizing solution: | HF:H$_2$O:C$_2$H$_5$OH = 1:1:1 |
| Time: | 5 (min) |
| Thickness of porous silicon portion: | 6 ($\mu$m) |
| (Second Step) | |
| Current density: | 33 (mA · cm$^{-2}$) |
| Anodizing solution: | HF:H$_2$O:C$_2$H$_5$OH = 1:1:1 |
| Time: | 1.3 (min) |
| Thickness of porous silicon portion: | 3 ($\mu$m) |

The first porous Si layer to be formed at the first step of the anodization is used to form a high-quality epitaxial Si layer thereon. The second porous Si layer to be formed under the first porous Si layer at the second step of the anodization is used as a separation layer. Note that if the first substrate is removed by grinding a bonded substrate stack, a porous Si layer is not used as a separation layer.

The position of a separation surface (a surface to be separated) was limited to the vicinity of the interface between the first porous Si layer and second porous Si layer. This was effective in planarization of the separation surface.

Example 3

A DRAM having a trench capacitor was formed in the non-SOI region of a semiconductor substrate which was manufactured by each of the methods described in the examples 1 and 2 and had a structure shown in FIG. 3L. Other devices including a logic circuit were formed in the SOI region. The methods described in the examples 1 and 2 are bonding methods, and the surface of a semiconductor substrate to be manufactured is flat. For this reason, in the lithography step, the entire region of exposure shots fell within the focus-range of the depth of a projection optical system, and no local defocusing (defocusing due to unevenness of the surface of the substrate) occurred. Since a single-crystal Si layer having a sufficient thickness was formed in the non-SOI region, no trouble occurred in forming the trench capacitor.

Additionally, the above semiconductor substrate is effectively used to form an integrated circuit other than a DRAM-embedded one.

Other Example

Various film forming techniques such as CVD, MBE, sputtering, liquid phase growth can be applied to the epitaxial growth step for forming the first semiconductor layer and the second semiconductor layer.

Also, various other etchants (e.g., a mixture of a hydrofluoric acid solution, nitric acid solution, and acetic acid solution) can be applied to the step of selectively etching a separation layer (porous layer, ion implantation layer, or the like) left upon splitting, in addition to a mixture of a 49% hydrofluoric acid solution, a 30% hydrogen peroxide solution, and water as described above.

The present invention can, e.g., improve the quality of a substrate to be manufactured through a step of bonding two substrates.

As many apparently widely different embodiments of the present invention can be made without departing from the spirit and scope thereof, it is to be understood that the invention is not limited to the specific embodiments thereof except as defined in the appended claims.

What is claimed is:

1. A method for manufacturing a partial SOI substrate, the method comprising:

a step of forming a first substrate which has a first semiconductor layer, a partial insulating layer on the first semiconductor layer, and a second semiconductor layer on the first semiconductor layer exposed in the partial insulating layer and the partial insulating layer;

a step of forming a third layer on a surface of the second semiconductor layer of the first substrate;

a step of planarizing a surface of the third layer; and a step of bonding a second substrate to the planarized third layer of the first substrate to form a bonded substrate stack, wherein an SOI layer in the partial SOI substrate is formed the first semiconductor layer being on the partial insulating layer.

2. The method according to claim 1, further comprising a step of removing a part of the first substrate from the bonded substrate stack such that the first semiconductor layer is exposed.

3. The method according to claim 1, wherein in the step of forming the first substrate includes a step of forming a separation layer under the first semiconductor layer, and the method further comprises a step of splitting the bonded substrate stack at the separation layer.

4. The method according to claim 1, further comprising a step of planarizing a surface of the second semiconductor layer after the step of forming the first substrate and before the step of forming the third layer.

5. The method according to claim 1, wherein in the step of forming the third layer, a polycrystalline semiconductor layer is formed as the third layer.

6. The method according to claim 1, wherein in the step of forming the third layer, an amorphous semiconductor layer is formed as the third layer.

7. The method according to claim 1, wherein in the step of forming the third layer, an insulating layer is formed as the third layer.

8. The method according to claim 7, wherein in the insulating layer comprises an oxide film.

9. The method according to claim 7, wherein in the step of forming the third layer, the oxide film is formed by CVD.

10. The method according to claim 1, wherein in growing the second semiconductor layer, a single-crystal semiconductor layer made of the same material as a material of the first semiconductor layer is grown as a part of the second semiconductor layer on the first semiconductor layer exposed in the insulating layer.

11. The method according to claim 1, wherein in growing the second semiconductor layer, a single-crystal semiconductor layer made of the same material as a material of the first semiconductor layer is grown as a part of the second semiconductor layer on the first semiconductor layer exposed in the insulating layer, and a polycrystalline semiconductor layer made of the same material as the first semiconductor layer is grown as another part of the second semiconductor layer on the partial insulating layer.

12. The method according to claim 1, wherein in the step of forming the first substrate includes a step of forming a porous layer serving as the separation layer on a semiconductor substrate by anodization and sequentially forming the first semiconductor layer and partial insulating layer on the porous layer.

* * * * *

UNITED STATES PATENT AND TRADEMARK OFFICE
CERTIFICATE OF CORRECTION

PATENT NO. : 6,951,796 B2
DATED : October 4, 2005
INVENTOR(S) : Kiyofumi Sakaguchi It is certified that error appears in the above-identified patent and that said Letters Patent is hereby corrected as shown below:

Column 11,
Line 44, "rootmean-square" should read -- root-mean-square --.

Column 12,
Line 30, "8 (mA·cm)" should read -- 8 (mA·cm$^{-2}$) --.

Column 15,
Line 31, "substrate lob" should read -- substrate 10b --.

Column 20,
Line 63, "rootmean-square" should read -- root-mean-square --.

Column 22,
Line 62, "formed" should read -- formed by --.

Column 23,
Line 1, "in" should be deleted; and
Line 19, "in" should be deleted.

Column 24,
Line 15, "in" should be deleted.

Signed and Sealed this

Fourteenth Day of March, 2006

JON W. DUDAS
*Director of the United States Patent and Trademark Office*